(12) United States Patent
Son et al.

(10) Patent No.: US 10,746,366 B2
(45) Date of Patent: Aug. 18, 2020

(54) LIGHT EMITTING DEVICE, OPTICAL MODULE COMPRISING SAME DEVICE, AND VEHICLE COMPRISING SAME MODULE

(71) Applicant: LG INNOTEK CO., LTD., Seoul (KR)

(72) Inventors: Chang Gyun Son, Seoul (KR); Ki Cheol Kim, Seoul (KR); Kang Yeol Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 42 days.

(21) Appl. No.: 16/066,248

(22) PCT Filed: Nov. 15, 2016

(86) PCT No.: PCT/KR2016/013117
§ 371 (c)(1),
(2) Date: Jun. 26, 2018

(87) PCT Pub. No.: WO2017/116002
PCT Pub. Date: Jul. 6, 2017

(65) Prior Publication Data
US 2019/0011100 A1    Jan. 10, 2019

(30) Foreign Application Priority Data
Dec. 30, 2015    (KR) .................. 10-2015-0189808

(51) Int. Cl.
*F21S 41/32*    (2018.01)
*F21S 41/176*    (2018.01)
(Continued)

(52) U.S. Cl.
CPC .......... *F21S 41/176* (2018.01); *B60Q 1/0023* (2013.01); *B60Q 1/085* (2013.01);
(Continued)

(58) Field of Classification Search
CPC .......... F21S 41/14; F21S 41/16; F21S 41/141; F21S 41/176; F21S 41/32; F21S 41/321;
(Continued)

(56) References Cited

U.S. PATENT DOCUMENTS

2006/0256183 A1    11/2006    Masuda
2010/0231863 A1    9/2010     Hikmet et al.
(Continued)

FOREIGN PATENT DOCUMENTS

DE    10-2012-100141    7/2013
EP    2 292 464        3/2011
(Continued)

OTHER PUBLICATIONS

European Search Report dated Dec. 12, 2018 issued in Application No. 16881955.5.
(Continued)

*Primary Examiner* — Benyam Haile
(74) *Attorney, Agent, or Firm* — KED & Associates LLP

(57) ABSTRACT

A light emitting device of an embodiment includes at least one light source; a wavelength conversion unit for converting the wavelength of excitation light so as to emit the excitation light having the converted wavelength as conversion light; a light transfer unit disposed on a light path between the at least one light source and the wavelength conversion unit for transferring the excitation light to the wavelength conversion unit; and a light-path controller moving at least a part of the light transfer unit so as to adjust at least one from among the direction and intensity of excitation light which enters the wavelength conversion unit.

18 Claims, 20 Drawing Sheets

(51) Int. Cl.
| | |
|---|---|
| *F21K 9/64* | (2016.01) |
| *F21S 41/63* | (2018.01) |
| *H05B 47/10* | (2020.01) |
| *F21S 41/30* | (2018.01) |
| *F21S 41/20* | (2018.01) |
| *F21K 9/65* | (2016.01) |
| *F21K 9/68* | (2016.01) |
| *F21K 9/69* | (2016.01) |
| *F21S 41/16* | (2018.01) |
| *F21S 41/37* | (2018.01) |
| *F21S 41/141* | (2018.01) |
| *B60Q 1/00* | (2006.01) |
| *B60Q 1/08* | (2006.01) |
| *B60Q 1/14* | (2006.01) |
| *B60R 1/00* | (2006.01) |
| *H04N 7/18* | (2006.01) |
| *F21S 41/675* | (2018.01) |
| *F21Y 115/30* | (2016.01) |
| *F21Y 115/10* | (2016.01) |
| *F21W 102/13* | (2018.01) |

(52) U.S. Cl.
CPC .............. *B60Q 1/143* (2013.01); *B60R 1/00* (2013.01); *F21K 9/64* (2016.08); *F21K 9/65* (2016.08); *F21K 9/68* (2016.08); *F21K 9/69* (2016.08); *F21S 41/141* (2018.01); *F21S 41/16* (2018.01); *F21S 41/20* (2018.01); *F21S 41/285* (2018.01); *F21S 41/30* (2018.01); *F21S 41/32* (2018.01); *F21S 41/37* (2018.01); *F21S 41/635* (2018.01); *H04N 7/183* (2013.01); *H05B 47/10* (2020.01); *B60Q 2300/112* (2013.01); *B60Q 2300/12* (2013.01); *B60R 2300/80* (2013.01); *F21S 41/675* (2018.01); *F21W 2102/13* (2018.01); *F21Y 2115/10* (2016.08); *F21Y 2115/30* (2016.08)

(58) Field of Classification Search
CPC ...... F21S 41/322; F21S 41/675; F21S 41/125; F21V 13/00; F21V 13/06; G02B 26/002; G02B 26/007; G02B 26/008; G02B 26/0816; G02B 26/0833

See application file for complete search history.

(56) References Cited

U.S. PATENT DOCUMENTS

| | | |
|---|---|---|
| 2010/0315605 A1 | 12/2010 | Arita |
| 2012/0051074 A1 | 3/2012 | Takahashi |
| 2012/0105967 A1* | 5/2012 | Hunter .............. G01N 15/1436 359/634 |
| 2013/0027951 A1* | 1/2013 | Takahashi ................ B60Q 1/12 362/465 |
| 2013/0258689 A1 | 10/2013 | Takahira et al. |
| 2014/0254188 A1 | 9/2014 | Masuda et al. |
| 2014/0333900 A1* | 11/2014 | Aboshi .................. G02B 27/48 353/20 |
| 2016/0131321 A1 | 5/2016 | Yamanaka et al. |
| 2017/0057399 A1 | 3/2017 | Yatsuda et al. |

FOREIGN PATENT DOCUMENTS

| | | |
|---|---|---|
| EP | 2 551 154 | 1/2013 |
| JP | 3648363 | 2/2005 |
| KR | 10-2014-0103981 | 8/2014 |
| KR | 10-2015-0044651 | 4/2015 |
| WO | WO 2009/047683 | 4/2009 |
| WO | WO 2015/019537 | 2/2015 |
| WO | WO 2015/122481 A1 | 8/2015 |

OTHER PUBLICATIONS

International Search Report (with English Translation) and Written Opinion dated Feb. 22, 2017 issued in Application No. PCT/KR2016/013117.
European Examination Report dated Apr. 9, 2020 issued in Application No. 16 881 955.5.

* cited by examiner

FIG. 5

LIGHT EMITTING DEVICE, OPTICAL MODULE COMPRISING SAME DEVICE, AND VEHICLE COMPRISING SAME MODULE

CROSS-REFERENCE TO RELATED PATENT APPLICATIONS

This application is a U.S. National Stage Application under 35 U.S.C. § 371 of PCT Application No. PCT/KR2016/013117, filed Nov. 15, 2016, which claims priority to Korean Patent Application No. 10-2015-0189808, filed Dec. 30, 2015, whose entire disclosures are hereby incorporated by reference.

TECHNICAL FIELD

Embodiments relate to a light-emitting device, an optical module including the device, and a vehicle including the module.

BACKGROUND ART

Light-emitting devices are widely used for domestic, industrial, and vehicular applications. For example, a light source of a light-emitting device used in a vehicular headlamp may be a halogen (or incandescent) bulb, a high-intensity discharge (HID) lamp, a xenon lamp, a light-emitting diode (LED), or the like. In addition, there is an increasing interest in a laser diode (LD) as a next-generation light source of a light-emitting device.

Vehicular headlamps are becoming more advanced technologically, functionally, and aesthetically. Changes to light sources such that they have a reduced size while exhibiting the same energy efficiency and light output, material changes, precision injection and machining, and the like are driving this advancement. Such light sources are increased in brightness and reduced in size while evolving from a halogen bulb or an HID lamp to an LED or an LD.

The light-emitting device is not limited, in terms of the functionality thereof, merely to illuminating a dark place, but may be utilized to ensure visibility in the state in which a high beam is turned on at all times while the distribution of light thereof is controlled, or as a device for communication with pedestrians or other vehicles. In addition, in terms of the aesthetic design thereof, headlamps are becoming slimmer and are implemented not only in a linear shape but also in a curvilinear shape and the like.

In the vehicular headlamp, an additional light source module, excluding a high beam or a low beam, is connected to an element for night vision use to provide visibility at night so as to improve the safety of pedestrians or drivers. When attempting to emit light towards a subject from such an element for night vision use, it is necessary to move an entire optical system including, for example, an actuator or a motor as well as a light source. This increases power consumption and introduces limitations such as the requirement to provide a space for the movement of the optical system.

DISCLOSURE

Technical Problem

Embodiments provide a light-emitting device capable of discharging light to various positions at various magnitudes with a simplified configuration, an optical module including the device, and a vehicle including the module.

Technical Solution

In one embodiment, a light-emitting device may include at least one light source configured to discharge excitation light, a wavelength conversion unit configured to convert a wavelength of the excitation light so as to emit the excitation light having the converted wavelength as converted light, a light transfer unit disposed on a light path between the at least one light source and the wavelength conversion unit to transfer the excitation light to the wavelength conversion unit, and a light-path controller configured to adjust at least one of a direction or a size (or, intensity) of the excitation light to be incident on the wavelength conversion unit by moving at least a portion of the light transfer unit.

For example, the light source may discharge laser light as the excitation light. Alternatively, the light source may include a light-emitting diode configured to discharge the excitation light.

For example, the light transfer unit may include at least one collimation lens configured to emit the excitation light, discharged from the at least one light source, in parallel.

For example, the light-path controller may adjust at least one of the direction or the size of the excitation light by moving the at least one collimation lens.

For example, the at least one light source may include a plurality of light sources configured to discharge the excitation light respectively, and the at least one collimation lens may include a plurality of collimation lenses configured to emit the excitation light, discharged from the plurality of light sources, in parallel, and the light transfer unit may further include a light-path conversion unit configured to gather a plurality of beams of the excitation light discharged from the plurality of collimation lenses into a single light beam, and a first reflecting element configured to reflect the single light beam.

For example, the plurality of light sources may include first and second light sources configured to discharge first light and second light respectively, and the light-path conversion unit may include a light-transmitting/reflecting element configured to transmit the first light in a first direction and reflect the second light, which is incident thereon in a second direction, which is orthogonal to the first direction, in the first direction so as to emit the single light beam.

For example, the plurality of light sources may include first and second light sources configured to discharge first light and second light respectively, and the light-path conversion unit may include a prism reflecting a second light which is incident in a direction parallel to a first direction in which a first light, which is one of the plurality of beams of the excitation light, is incident, the second light being another one of the plurality of beams of the excitation light, and the second direction being orthogonal to the first direction, and a light-transmitting/reflecting element configured to transmit the first light in the first direction and to reflect the second light, which is reflected in the second direction by the prism, in the first direction so as to emit the single light beam. The light-transmitting/reflecting element may include a polarization beam splitter or a birefringent material. The light transfer unit may further include an anti-reflection film coated over each of a light entrance surface and a light exit surface of the light-transmitting/reflecting element.

For example, the light transfer unit may further include a second reflecting element configured to reflect the light, reflected from the first reflecting element, to the wavelength conversion unit. The light-path controller may adjust at least one of the direction or the size of the excitation light by moving the second reflecting element.

For example, the light transfer unit may further include a refractive member configured to refract the single light beam gathered by the light-path conversion unit, and the first reflecting element may reflect the light refracted by the refractive member. The refractive member may include a glass plate.

For example, the light-path controller may adjust at least one of the direction or the size of the excitation light by moving the refractive member.

For example, the light-path controller may rotate the refractive member at a first angle relative to a second direction or at a second angle relative to a third direction, or may rotate the refractive member at the second angle relative to the third direction while rotating the refractive member at the first angle relative to the second direction, the excitation light may be incident on the wavelength conversion unit in a first direction, and each of the second and third directions may differ from the first direction.

For example, the wavelength conversion unit may be disposed at an outer side of a focal point so as to be spaced apart from the focal point in a direction away from the light source, may be disposed at the focal point, or may be disposed at an inner side of the focal point so as to be spaced apart from the focal point in a direction approaching the light source.

In another embodiment, an optical module includes the light-emitting device, a module controller configured to detect a position of a subject and to output a detected result as a module control signal, and an optical system configured to discharge the converted light emitted from the light-emitting device towards the subject based on at least one of the direction or the size adjusted by the light-path controller, wherein the light-path controller moves the light transfer unit in response to the module control signal.

In a further embodiment, a vehicle including an optical module includes an image capture unit configured to capture an image showing a view in front of the vehicle and generate a video signal, a display unit configured to display a portion of the captured image from the video signal to a driver, a signal processor configured to process the video signal and output a portion of the captured image to the display unit, a sensor unit configured to sense at least one of a movement speed or a movement direction of the vehicle, and a vehicle controller configured to generate a vehicle control signal for controlling the image capture unit, the display unit, and the signal processor, wherein the vehicle controller generates the vehicle control signal using a sensed result from the sensor unit, and wherein the light-path controller moves the light transfer unit in response to the vehicle control signal and the module control signal.

For example, the vehicle may further include a lighting module configured to discharge light from at least one of a high beam or a low beam under control of the vehicle controller.

Advantageous Effects

A light-emitting device, an optical module including the device, and a vehicle including the module according to embodiments may achieve, for example, reduced power consumption for implementation of the function thereof, a reduction in the amount of space occupied by the optical module, desired subdivision of positions to which light is emitted, an increase in freedom with regard to movement of a light transfer unit for a change in position, increased subject irradiation efficiency, farther light transfer, reduction in the volume of the optical module, and suitability in terms of aesthetic design for a headlamp, which is becoming slimmer.

DESCRIPTION OF DRAWINGS

FIG. 5 illustrates exemplary forms of light that reaches a virtual illuminance plane when moving a collimation lens.

BEST MODE

Figure 1:
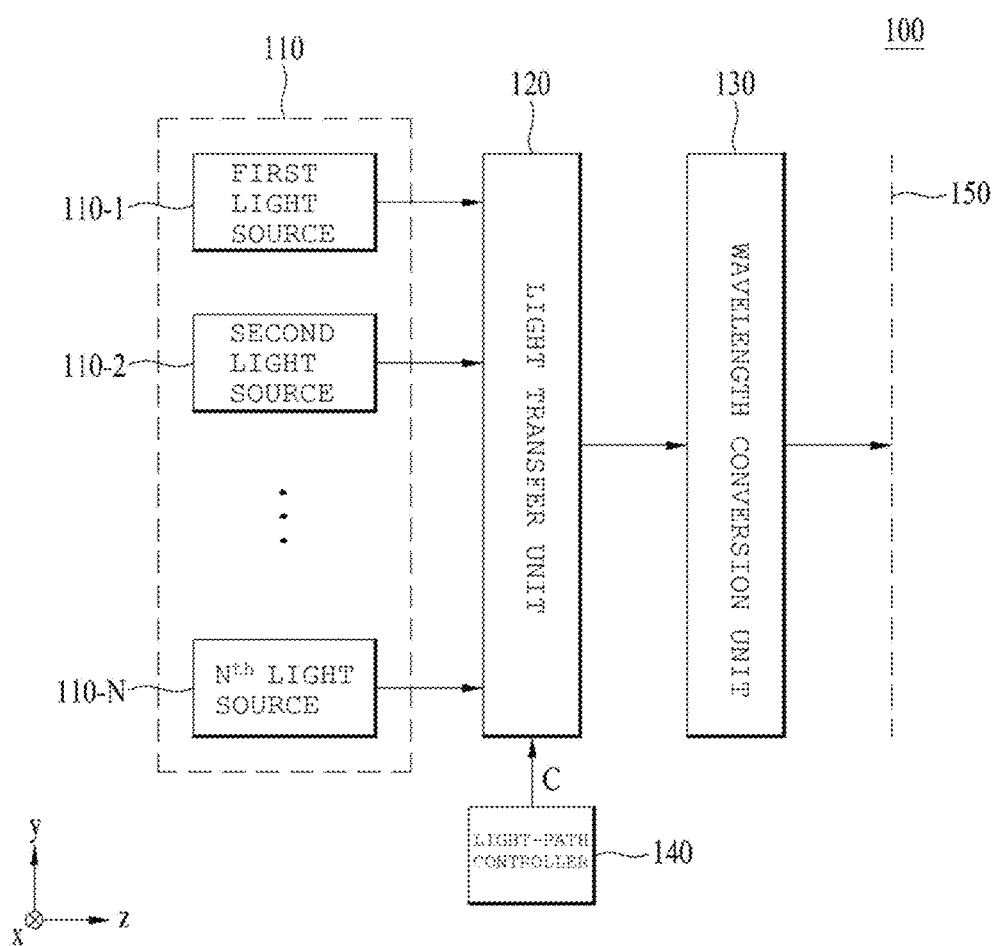
FIG. 1 is a block diagram of a light-emitting device according to an embodiment.
Figure 2A:
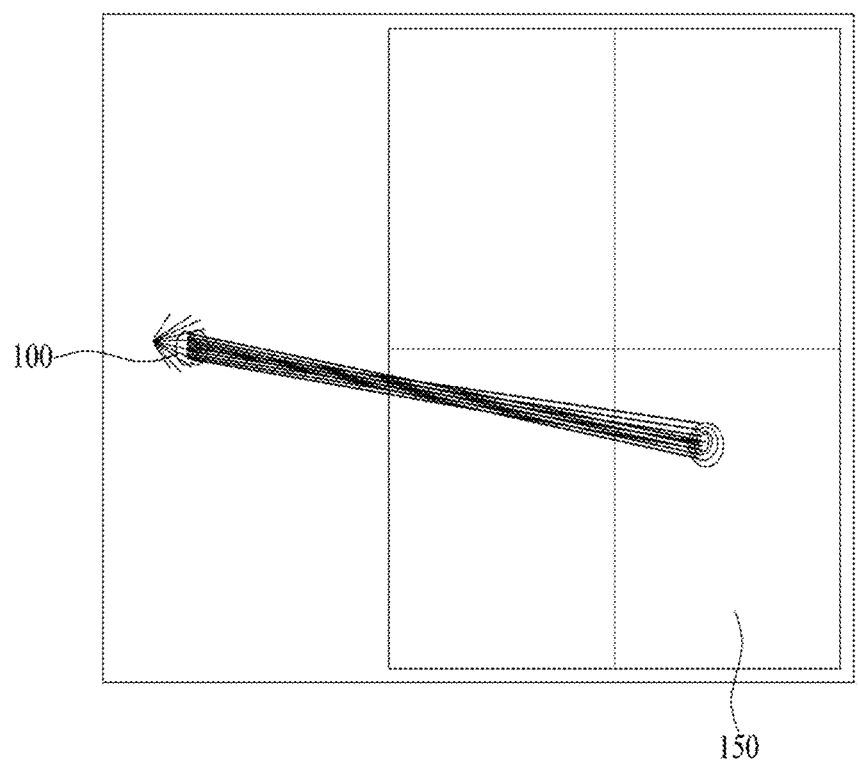
FIGS. 2A to 2E are views respectively illustrating different positions on a virtual illuminance plane, at which light from a wavelength conversion unit of the light-emitting device according to the embodiment is emitted.
Figure 2B:
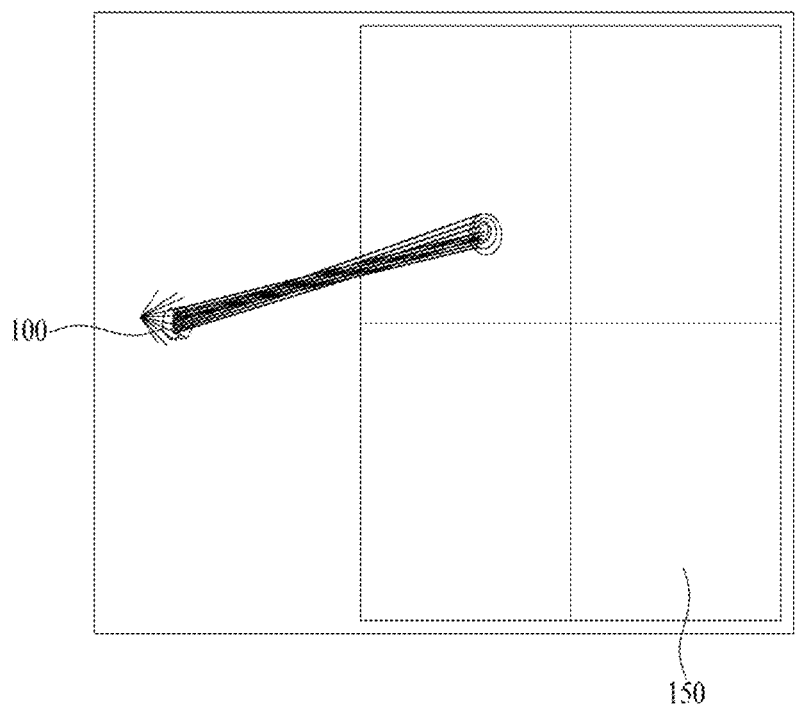
Figure 2C:
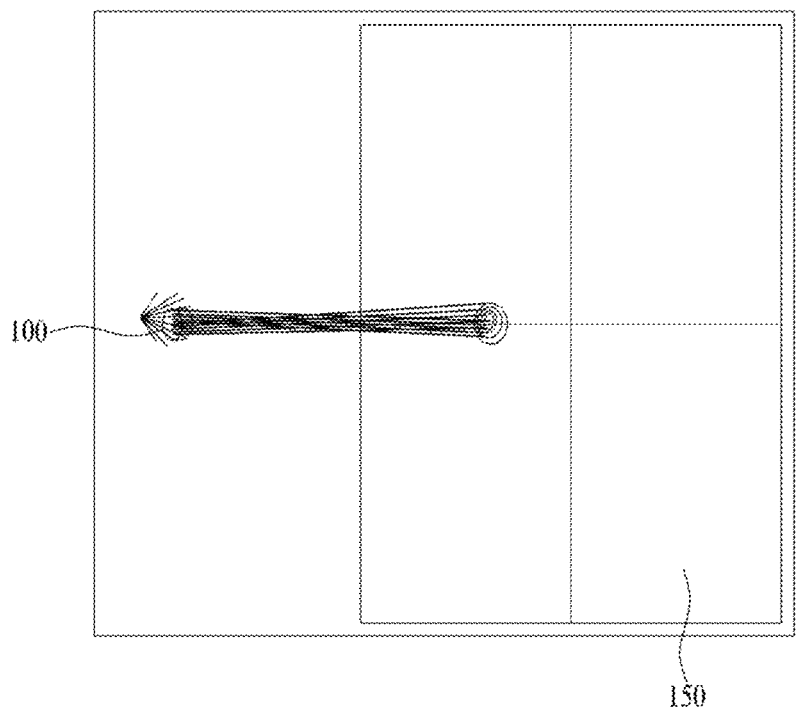
Figure 2D:
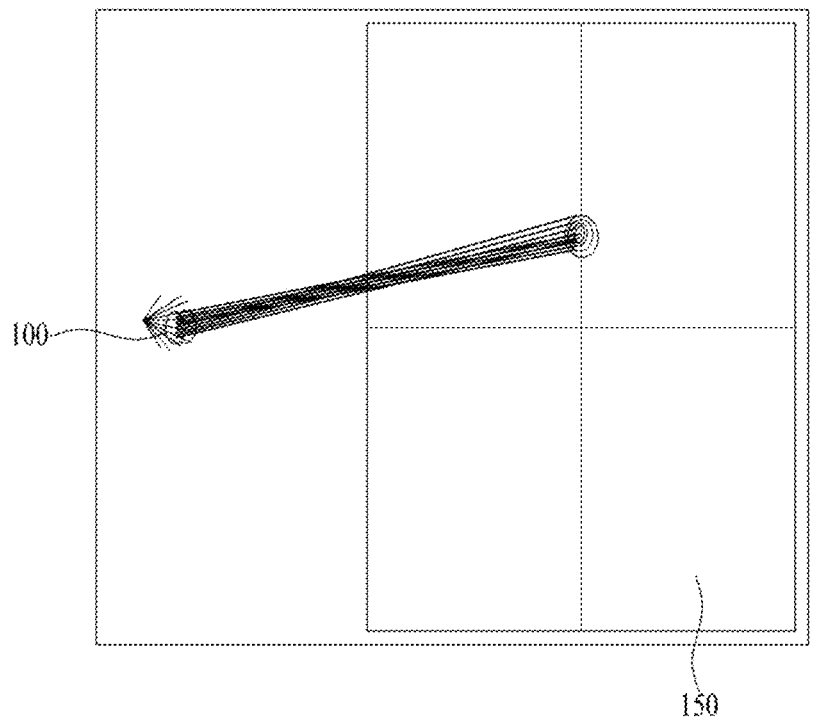
Figure 2E:
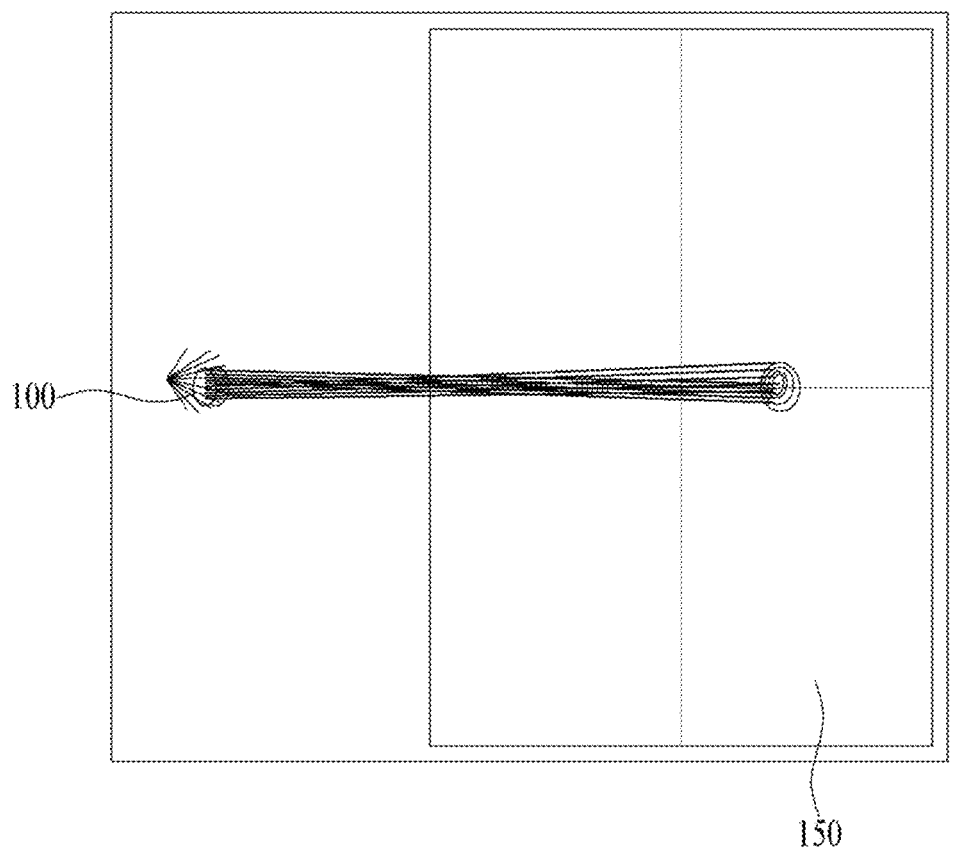

Hereinafter, embodiments will be described in detail with reference to the attached drawings. The embodiments may, however, be embodied in many alternate forms and the disclosure should not be construed as limited to the embodiments set forth herein. Accordingly, while the disclosure is susceptible to various modifications and alternative forms, specific embodiments thereof are shown by way of example in the drawings and will herein be described in detail. It should be understood, however, that there is no intent to limit the disclosure to the particular forms disclosed, but on the contrary, the disclosure is to cover all modifications, equivalents, and alternatives falling within the spirit and scope of the embodiments as defined by the claims.

In the description of the embodiments, it will be understood that when an element is referred to as being "on" or "under" another element, the term "on" or "under" means that the element is "directly" on or under another element or is "indirectly" formed such that an intervening element may also be present. In addition, it will also be understood that the criteria of "on" or "under" is on the basis of the drawings.

In addition, when an element is referred to as being "on" or "under" another element, this also may include not only the upward direction but also the downward direction based on the element.

In addition, in the description of the various embodiments, although relative terms such as, for example, "first", "second", "on/upper/above" and "beneath/lower/below" may be used to distinguish any one substance or element with another substance or element without requiring or containing any physical or logical relationship or sequence between these substances or elements.

Hereinafter, light-emitting devices 100; 100A, 100B, and 100C according to embodiments will be described using the Cartesian coordinate system, the light-emitting devices may of course be described using other coordinate systems. With the Cartesian coordinate system, the x-axis, the y-axis and the z-axis illustrated in the respective drawings are orthogonal to one another, but the embodiments are not limited thereto. That is, the x-axis, the y-axis and the z-axis may not orthogonal to one another, but may cross one another.

FIG. 1 is a block diagram of a light-emitting device 100 according to an embodiment. As illustrated, the light-emitting device may include a light source unit 110, a light transfer unit 120, a wavelength conversion unit 130, and a light-path controller 140.

The light source unit 110 serves to discharge excitation light. To this end, the light source unit 110 may include first to $N^{th}$ light sources 110-1, 110-2, ... and 110-N. Here, "N" is a positive integer that is equal to or greater than 1. Each of the first to $N^{th}$ light sources 110-1, 110-2, ... and 110-N may discharge excitation light. According to the embodiment, each of the first to $N^{th}$ light sources 110-1, 110-2, ... and 110-N may discharge laser light as excitation light. That is, an $n^{th}$ light source 110-$n$ may discharge $n^{th}$ laser light as excitation light. Here, $1 \leq n \leq N$. For example, the wavelength of laser light discharged from the $n^{th}$ light source 110-$n$ may range from 420 nm to 480 nm, which is a blue wavelength band, but the embodiment is not limited thereto. In addition, the larger the electric power of the $n^{th}$ light source 110-$n$, the better, and the electric power may be changed based on the performance of the wavelength conversion unit 130 that is used and the purpose of use of the light-emitting device 100.

As described above, each of the first to $N^{th}$ light sources 110-1, 110-2, ... and 110-N may be a laser diode (LD) that emits laser light, but the embodiment is not limited thereto. That is, according to another embodiment, each of the first to $N^{th}$ light sources 110-1, 110-2, ... and 110-N may be a light-emitting diode (LED).

The wavelength conversion unit 130 converts the wavelength of excitation light, which is incident thereon by way of the light transfer unit 120 after being discharged from the light source unit 110, and emits the excitation light having the converted wavelength as converted light.

The wavelength of the excitation light may vary while the excitation light passes through the wavelength conversion unit 130. However, not all of the light that has passed through the wavelength conversion unit 130 may be light having the converted wavelength. When the wavelength of the excitation light is converted by the wavelength conversion unit 130, white light or light having a desired color temperature may be emitted through a virtual illuminance plane 150. To this end, the wavelength conversion unit 130 may include at least one of phosphors, for example, ceramic phosphors, lumiphores, or YAG single-crystals. Here, the lumiphores may be luminescent materials or a structure including luminescent materials.

In addition, by adjusting the concentration, particle size, and particle-size distribution of various components included in the wavelength conversion unit 130, the thickness of the wavelength conversion unit 130, the surface roughness of the wavelength conversion unit 130, air bubbles, and the like, light having a desired color temperature may be emitted from the wavelength conversion unit 130. To this end, a wavelength conversion material included in the wavelength conversion unit 130 may convert the wavelength band of light within a color temperature range from 3000K to 9000K. That is, the color temperature range of the light, the wavelength of which is converted by the wavelength conversion material, may be from 3000K to 9000K, but the embodiment is not limited thereto.

The wavelength conversion material may be any of various types. For example, the wavelength conversion material may be any of three types, i.e. a phosphor in glass (PIG) type, a polycrystalline type (or ceramic type), or a monocrystalline type.

The light transfer unit 120 is disposed on a light path between the light source unit 110 and the wavelength conversion unit 130, and serves to transfer the excitation light, discharged from the light source unit 110, to the wavelength conversion unit 130.

The light-path controller 140 may adjust at least one of the direction or size (or, intensity) of the excitation light to be incident on the wavelength conversion unit 130 by moving a portion of the light transfer unit 120.

When at least one of the direction or size of the excitation light to be incident on the wavelength conversion unit 130 varies, at least one of the direction or size of the converted light discharged from the wavelength conversion unit 130 varies.

In conclusion, at least one of the direction or size of the converted light, which reaches the virtual illuminance plane 150, varies according as at least one of the direction or size of the excitation light to be incident on the wavelength conversion unit 130 varies.

FIGS. 2A to 2E are views respectively illustrating different positions on the virtual illuminance plane 150, to which the light from the wavelength conversion unit 130 of the light-emitting device 100 according to the embodiment is emitted.

As illustrated in FIGS. 2A to 2E, it can be appreciated that, when the light-path controller 140 moves a portion of the light transfer unit 120, the position that light reaches on the virtual illuminance plane 150 varies. For example, the position that light reaches on the virtual illuminance plane 150 may be changed by moving a portion of the light transfer unit 120 in at least one of the x-axis direction or the y-axis direction. In addition, the magnitude of the light that reaches the virtual illuminance plane 150 may be increased or reduced by moving a portion of the light transfer unit 120 in the z-axis direction. For example, the area of the light that reaches the virtual illuminance plane 150 may be increased when moving a portion of the light transfer unit 120 away from the wavelength conversion unit 130, compared to when moving a portion of the light transfer unit 120 towards the wavelength conversion unit 130.

Hereinafter, an embodiment of the light-emitting device 100 illustrated in FIG. 1 will be described with reference to the accompanying drawings.

Figure 3:
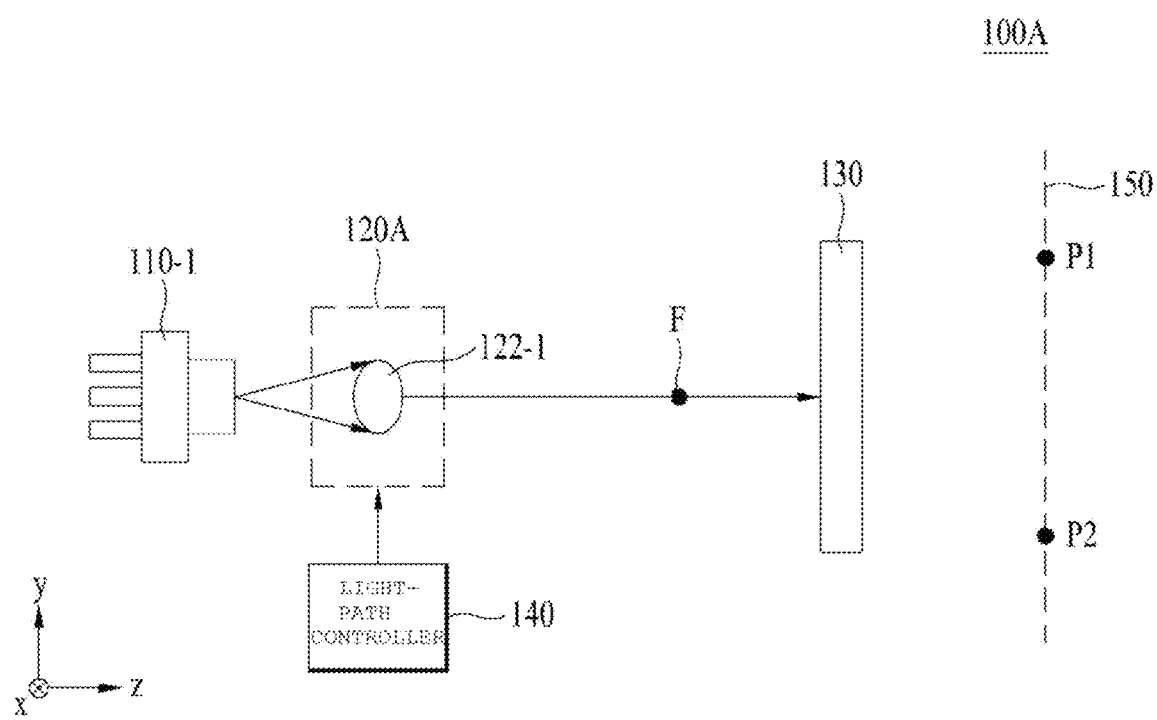
FIG. 3 illustrates a cross-sectional view of an embodiment of the light-emitting device illustrated in FIG. 1.
Figure 4:
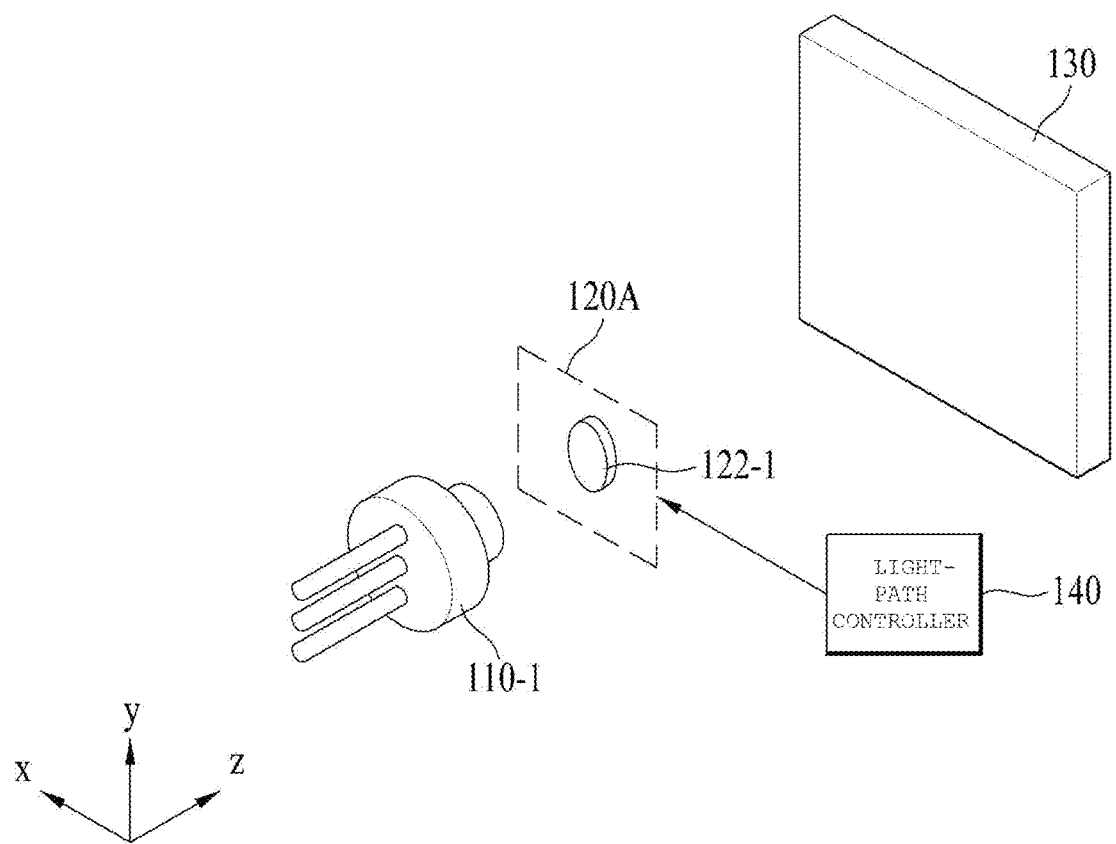
FIG. 4 illustrates a perspective view of the light-emitting device according to the embodiment illustrated in FIG. 3.

FIG. 3 illustrates a cross-sectional view of an embodiment 100A of the light-emitting device 100 illustrated in FIG. 1, and FIG. 4 illustrates a perspective view of the light-emitting device 100A according to the embodiment illustrated in FIG. 3.

The light-emitting device 100A illustrated in FIGS. 3 and 4 may include a light source 110-1, a light transfer unit 120A, the wavelength conversion unit 130, and the light-path controller 140. The light source 110-1, the light transfer unit 120A, the wavelength conversion unit 130, and the light-path controller 140 illustrated in FIGS. 3 and 4 correspond to respective embodiments of the light source 110-1, the light transfer unit 120, the wavelength conversion unit 130, and the light-path controller 140 illustrated in FIG. 1 and perform the same functions, and thus a repeated description thereof will be omitted.

The light-emitting device 100A illustrated in FIGS. 3 and 4 corresponds to the case in which N=1 in the light source unit 110 illustrated in FIG. 1.

The light transfer unit 120A may include a collimation lens 122-1. The collimation lens 122-1 may converge the excitation light discharged from the light source 110-1 on one point, or may emit parallel light, which has been converted to be parallel, to the wavelength conversion unit 130.

The number of collimation lenses may be the same as the number of light sources 110-1, 110-2, . . . and 110-N. That is, the respective collimation lenses may be disposed so as to correspond to the first to $N^{th}$ light sources 110-1, 110-2, . . . and 110-N. In the case of FIGS. 3 and 4, since the number of a light source 110-1 is one, the number of a collimation lens 122-1 may be one.

The collimation lens 122-1 may have any of various forms based on the discharge characteristics of the light source 110-1. In addition, the efficiency of the collimation lens 122-1 may be changed based on at least one of the size, material, surface state, presence or absence of a surface coating, or shape of the collimation lens 122-1.

For example, the efficiency of output of the collimation lens 122-1 relative to the input thereof may be equal to or greater than 80%, but the embodiment is not limited thereto. In addition, the divergence angle of the light that has passed through the collimation lens 122-1 may be within ±1°, but the embodiment is not limited thereto.

Figure 5:
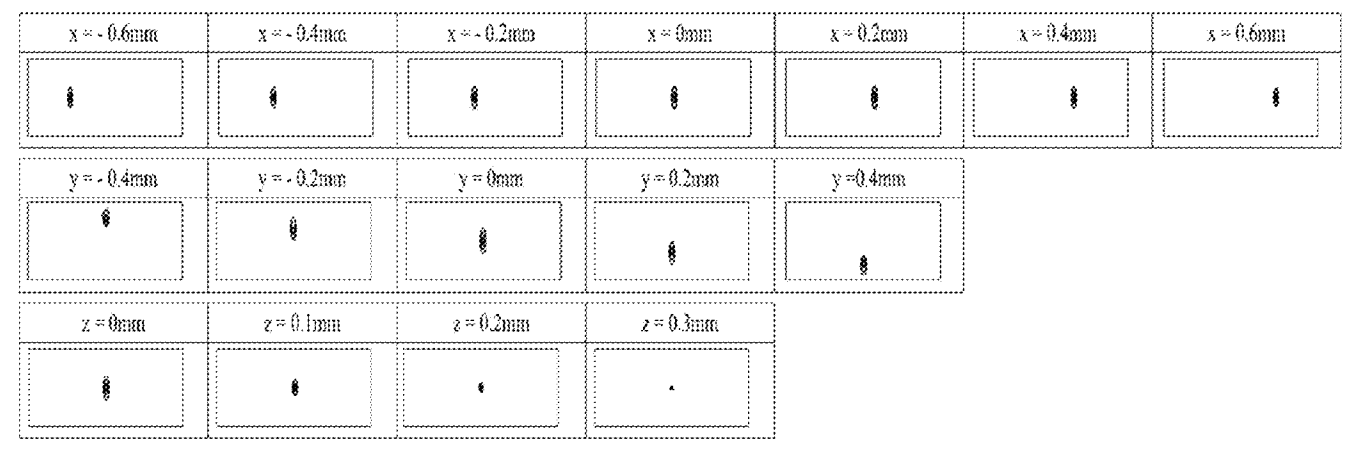

FIG. 5 illustrates various exemplary forms of light that reaches the virtual illuminance plane 150 when moving the collimation lens 122-1.

The light-path controller 140 may adjust at least one of the direction or size of the excitation light to be incident on the wavelength conversion unit 130 by moving the collimation lens 122-1. To this end, the light-path controller 140 may include a voice coil motor (VCM), an actuator, a motor, or the like, which moves the collimation lens 122-1.

When at least one of the direction or size of the excitation light to be incident on the wavelength conversion unit 130 is adjusted, at least one of the direction or size of the converted light emitted from the wavelength conversion unit 130 is also adjusted as described above. For example, when the light-path controller 140 moves the collimation lens 122-1, as illustrated in FIG. 3, the converted light may be directed to a first position P1 or a second position P2 on the virtual illuminance plane 150. By moving only the collimation lens 122-1 as described above, it is possible to emit light to a desired position (e.g., P1 or P2) on the virtual illuminance plane 150.

For example, referring to FIG. 5, it can be appreciated that the position and magnitude of the light emitted to the virtual illuminance plane 150 are changed when the collimation lens 122-1 is moved at an interval of 0.2 mm along the x-axis within a range from −0.6 mm to 0.6 mm and along the y-axis within a range from −0.4 mm to 0.4 mm, and is also moved at an interval of 0.1 mm along the z-axis from 0 mm to 0.3 mm.

As illustrated in FIG. 3, the wavelength conversion unit 130 may be disposed with being spaced apart from a focal point F in a direction away from the light source 110-1, i.e. at the outer side of the focal point F, but the embodiment is not limited thereto. That is, according to another embodiment, the wavelength conversion unit 130 may be located at the focal point F, or may be disposed with being spaced apart from the focal point F in a direction approaching the light source 110-1, i.e. at the inner side of the focal point F.

Figure 6:
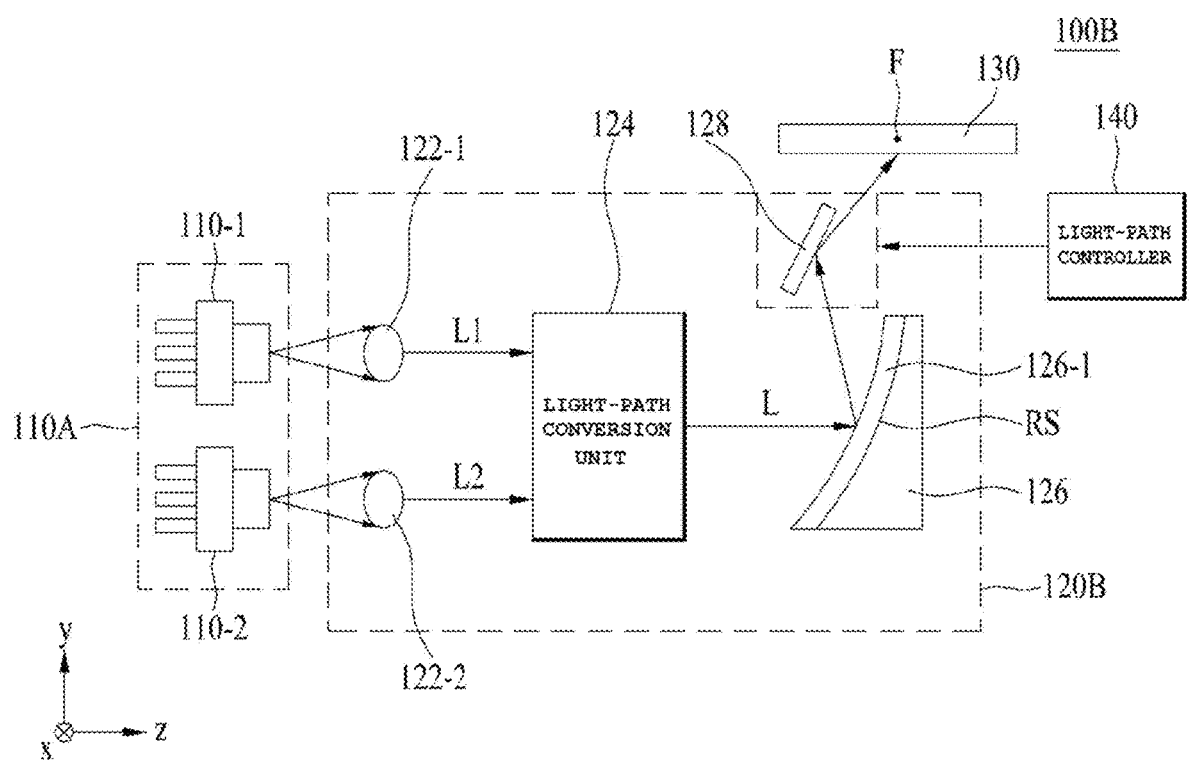
FIG. 6 illustrates a cross-sectional view of another embodiment of the light-emitting device illustrated in FIG. 1.

FIG. 6 illustrates a cross-sectional view of another embodiment 100B of the light-emitting device 100 illustrated in FIG. 1. Here, for convenience, the number of light sources will be assumed to be and described as two, but the embodiment is not limited as to the number of light sources. That is, the number of light sources may be greater than 2.

The light-emitting device 100B illustrated in FIG. 6 may include a light source unit 110A, a light transfer unit 120B, the wavelength conversion unit 130, and the light-path controller 140. Here, the light source unit 110A, the light transfer unit 120B, the wavelength conversion unit 130, and the light-path controller 140 illustrated in FIGS. 3 and 4 correspond to respective embodiments of the light source unit 110, the light transfer unit 120, the wavelength conversion unit 130, and the light-path controller 140 illustrated in FIG. 1 and perform the same functions, and thus a repeated description thereof will be omitted.

The light-emitting device 100B illustrated in FIG. 6 corresponds to the case in which N=2 in the light source unit 110 illustrated in FIG. 1.

The light source unit 110A may include first and second light sources 110-1 and 110-2. Here, each of the first and second light sources 110-1 and 110-2 may discharge laser light as excitation light.

The light transfer unit 120B serves to gather a plurality of beams of light, emitted from the light source unit 110A, into a single light beam and to transfer the same to the wavelength conversion unit 130. To this end, the light transfer unit 120B may include first and second collimation lenses 122-1 and 122-2, a light-path conversion unit 124, a first reflecting element 126, and a second reflecting element 128.

The first collimation lens 122-1 serves to emit the excitation light discharged from the first light source 110-1 towards the light-path conversion unit 124 as parallel light. The second collimation lens 122-2 serves to emit the excitation light discharged from the second light source 110-2 towards the light-path conversion unit 124 as parallel light. Subsequently, the light-path conversion unit 124 serves to gather a plurality of beams of the excitation light emitted from the first and second collimation lenses 122-1 and 122-2 into a single light beam.

The light-path conversion unit 124 may have any of various configurations based on the manner in which the first and second light sources 110-1 and 110-2 are arranged. In addition, the size of the entire light-emitting device 100 may be changed based on the manner in which the first and second light sources 110-1 and 110-2 are arranged.

Figure 7A:
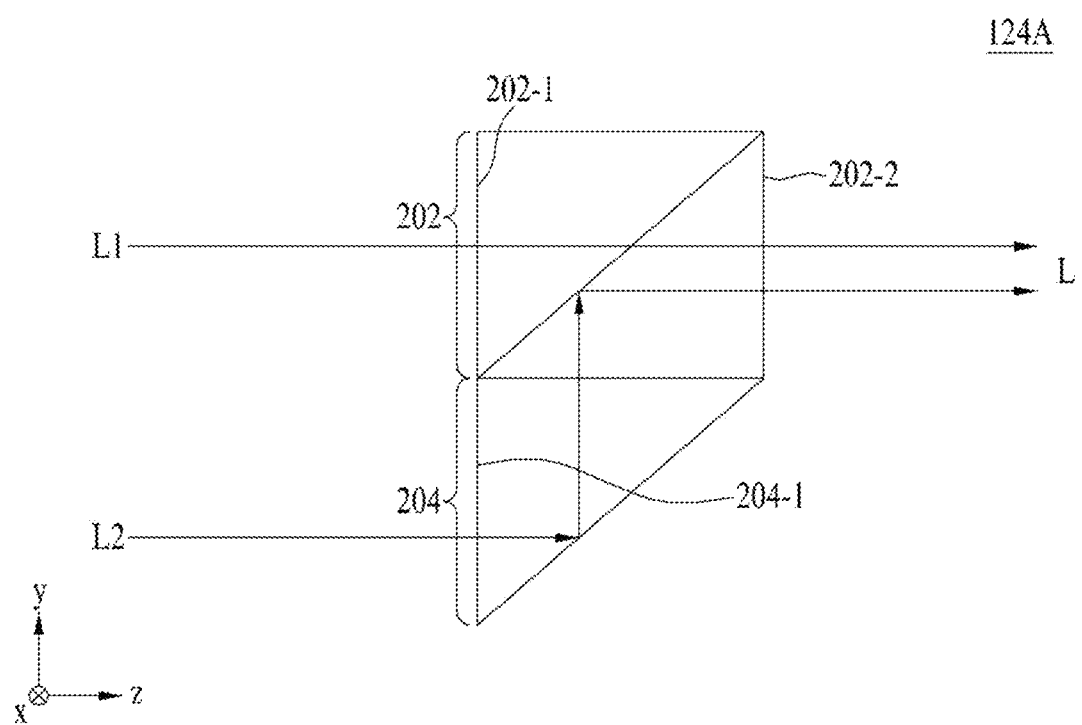
FIGS. 7A to 7C illustrate cross-sectional views of embodiments of a light-path conversion unit illustrated in FIG. 6.
Figure 7B:
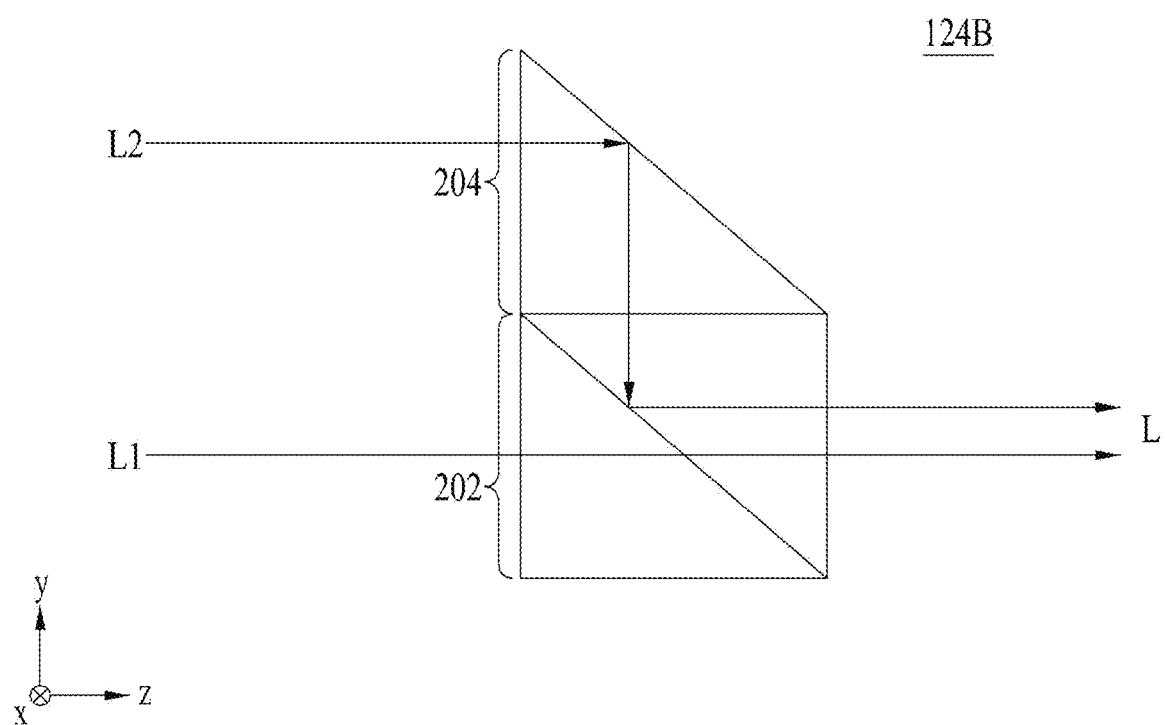
Figure 7C:
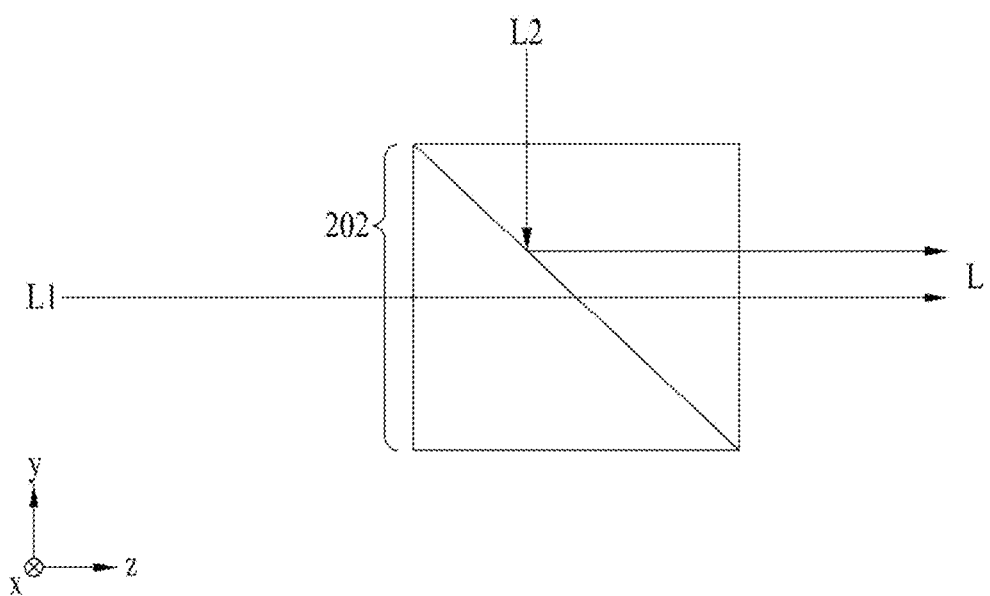
Figure 8:
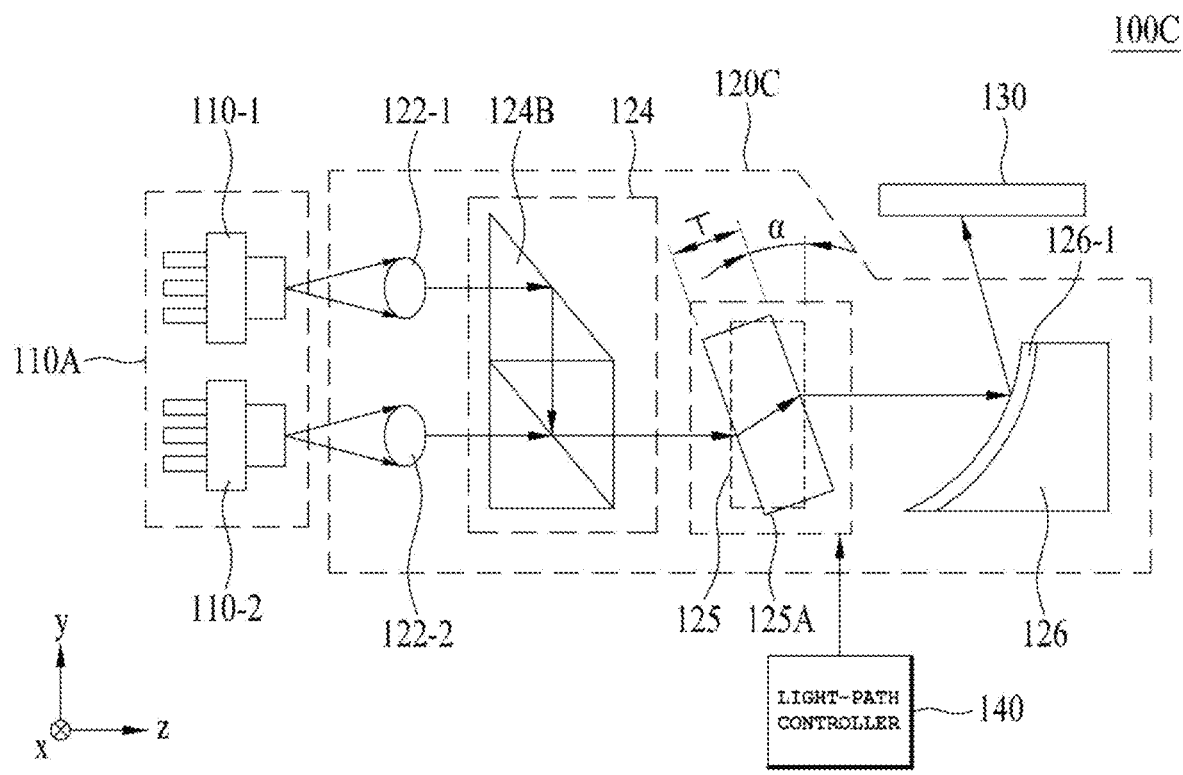
FIG. 8 illustrates a cross-sectional view of a further embodiment of the light-emitting device illustrated in FIG. 1.

FIGS. 7A to 7C illustrate cross-sectional views of embodiments 124A, 124B and 124C of the light-path conversion unit 124 illustrated in FIG. 6. To assist in understanding thereof, in FIGS. 7A to 7C, the light-path conversion unit 124 is illustrated as emitting two beams of light. However, in each of FIGS. 7A to 7C, a single light beam is emitted from the light-path conversion units 124A to 124C. As an example, to assist in understanding thereof, the light-path conversion unit 124B illustrated in FIG. 7B is illustrated as emitting two beams of light, but a single light beam is emitted from the light-path conversion unit 124B, as illustrated in FIG. 8.

Based on the manner in which the first and second light sources 110-1 and 110-2 are arranged, the light-path conversion unit 124A or 124B may include a light-transmitting/reflecting element 202 and a prism 204, as illustrated in FIG.

7A or 7B, or the light-path conversion unit 124C may include only the light-transmitting/reflecting element 202, as illustrated in FIG. 7C.

First, when the first and second light sources 110-1 and 110-2 are arranged parallel to each other in the y-axis direction, referring to FIG. 7A, first parallel light L1 emitted from the first collimation lens 122-1 is incident on the light-path conversion unit 124A in a first direction (e.g., the z-axis direction), and second parallel light L2 emitted from the second collimation lens 122-2 is incident on the light-path conversion unit 124A in a direction parallel to the first direction. Here, the prism 204 reflects the second light L2 in a second direction (e.g., the y-axis direction), which is orthogonal to the first direction. Then, the light-transmitting/reflecting element 202 transmits the first light L1 in the first direction and reflects the second light L2, reflected from the prism 204, in the first direction, so that a single light beam L in the first direction may be emitted from the light-path conversion unit 124A. Here, the first light L1 may proceed in a TM mode, the second light L2 may proceed in a TE mode, the transmittance of the first light L1 may be equal to or greater than 95%, and the reflectance of the second light L2 may be equal to or greater than 95%, but the embodiment is not limited thereto.

Alternatively, when the first and second light sources 110-1 and 110-2 are arranged parallel to each other in the y-axis direction, referring to FIG. 7B, the prism 204 reflects the second light L2, which is incident thereon in a direction parallel to the first direction in which the first light L1 is incident, in the second direction. Here, the first light L1 and the second light L2 may have a difference of 90° in polarizing direction. In this case, the light-transmitting/reflecting element 202 may transmit the first light L1 in the first direction, and may reflect the second light, reflected in the second direction from the prism 204, in the first direction, so as to emit a single light beam L.

On the other hand, when the first and second light sources 110-1 and 110-2 are arranged so as to cross each other, referring to FIG. 7C, the light-path conversion unit 124C may include only the light-transmitting/reflecting element 202. Referring to FIG. 7C, the light-transmitting/reflecting element 202 may transmit the first light L1 in the first direction, and may reflect the second light L2, incident in the second direction, in the first direction, so as to emit a single light beam L.

For the above-described operation, the light-transmitting/reflecting element 202 illustrated in FIGS. 7A to 7C may be implemented using a polarization beam splitter (PBS) or a birefringent material such as calcite. However, the embodiment is not limited as to the material of the light-transmitting/reflecting element 202 as long as the light-transmitting/reflecting element 202 is capable of gathering a plurality of beams of light into one.

When the light-transmitting/reflecting element 202 illustrated in FIGS. 7A to 7C is implemented using a PBS, each of a light entrance surface 202-1 and a light exit surface 202-2 of the PBS and a light entrance surface 204-1 of the prism 204 may be coated with an anti-reflection (AR) film, but the embodiment is not limited thereto. For example, the reflectance of the anti-reflection film may be equal to or less than 0.5%.

The first reflecting element 126 serves to reflect a single light beam, emitted from the light-path conversion unit 124, towards the focal point F. To this end, the first reflecting element 126 may have a parabolic cross-sectional shape, but the embodiment is not limited thereto. Here, although the wavelength conversion unit 130 is illustrated as being located at the focal point F, as described above, the wavelength conversion unit 130 may be disposed at the inner side or the outer side of the focal point F.

In addition, a mirror-coated transparent reflective layer 126-1 may be disposed on the upper surface RS of the first reflecting element 126. The reflective layer 126-1 serves to reflect a single light beam. However, according to another embodiment, instead of disposing the reflective layer 126-1 on the upper surface RS of the first reflecting element 126, the upper surface RS of the first reflecting element 126 may be mirror-coated.

In addition, the focal length, offset distance, and curvature radius R of the first reflecting element 126, having a parabolic shape, may be determined based on the angle at which the light that has passed through the light-path conversion unit 124 is reflected by the first reflecting element 126. That is, whether or not the angle at which the light is reflected by the first reflecting element 126 is 0°, which is the vertical direction, may be changed based on the application field of the light-emitting device 100, the manner in which the first and second light sources 110-1 and 110-2 are arranged, or the external dimensions of the light-emitting device 100.

The second reflecting element 128 serves to reflect the light, reflected by the first reflecting element 126, towards the wavelength conversion unit 130. The light-path controller 140 may adjust at least one of the direction or size of the excitation light by moving the second reflecting element 128.

For example, when the light-path controller 140 moves the second reflecting element 128 in at least one of the horizontal direction (e.g., the x-axis direction) or the vertical direction (e.g., the y-axis direction) while adjusting the angle of the second reflecting element 128, the position at which the light reaches the wavelength conversion unit 130 may be adjusted. In addition, when the light-path controller 140 adjusts the height of the second reflecting element 128 in the y-axis direction and the angle of the second reflecting element 128 relative to the vertical direction, the magnitude of light that reaches the wavelength conversion unit 130 may be adjusted.

Figure 9:
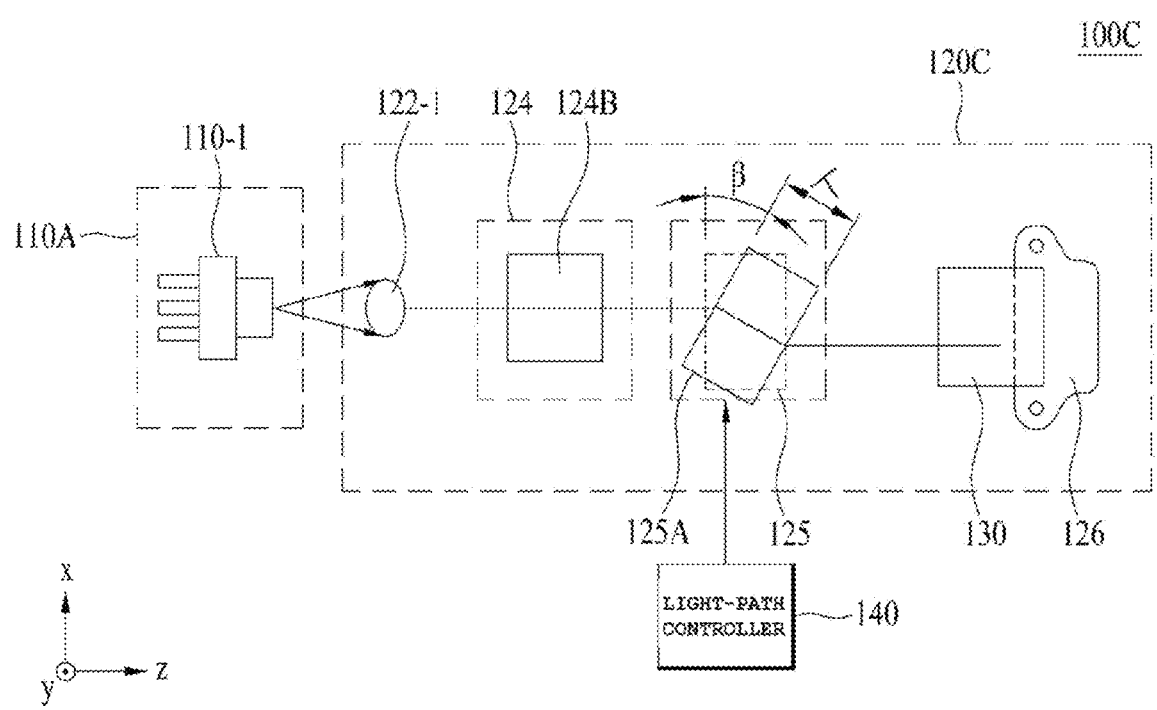
FIG. 9 illustrates a plan view of the light-emitting device illustrated in FIG. 8.

FIG. 8 illustrates a cross-sectional view of a still further embodiment 100C of the light-emitting device 100 illustrated in FIG. 1, and FIG. 9 illustrates a plan view of the light-emitting device 100C illustrated in FIG. 8.

The light-emitting device 100C illustrated in FIGS. 8 and 9 may include the light source unit 110A, a light transfer unit 120C, the wavelength conversion unit 130, and the light-path controller 140. Here, the light source unit 110A, the light transfer unit 120C, the wavelength conversion unit 130, and the light-path controller 140 correspond to respective embodiments of the light source unit 110, the light transfer unit 120, the wavelength conversion unit 130, and the light-path controller 140 illustrated in FIG. 1 and perform the same functions, and thus a repeated description thereof will be omitted.

The light-emitting device 100C illustrated in FIGS. 8 and 9 is similar to the light-emitting device 100B illustrated in FIG. 6, except that it does not include the second reflecting element 128 of the light-emitting device 100B illustrated in FIG. 6, but includes a refractive member 125, and thus, a repeated description thereof will be omitted.

The refractive member 125 refracts a single light beam gathered by the light-path conversion unit 124, and the refracted light is directed to the first reflecting element 126. To this end, the refractive member 125 may be implemented using a glass plate, but the embodiment is not limited thereto.

The first reflecting element 126 serves to reflect the light, refracted by the refractive member 125, towards the wavelength conversion unit 130.

The light-path controller 140 may adjust at least one of the direction or size of the excitation light by moving the refractive member 125. For example, the light-path controller 140 may move the refractive member 125 using a VCM, an actuator, a motor, or the like.

For example, referring to FIG. 8, the light-path controller 140 may adjust the direction of the excitation light by rotating the refractive member 125 at a first angle a relative to the y-axis direction. Alternatively, referring to FIG. 9, the light-path controller 140 may adjust the direction of the excitation light by rotating the refractive member 125 at a second angle β relative to the x-axis direction. In FIGS. 8 and 9, the refractive member after being rotated is designated by 125A.

In addition, the light-path controller 140 may rotate the refractive member 125 at the second angle β relative to the x-axis direction while rotating the refractive member 125 at the first angle α relative to the y-axis direction.

Figure 10A:
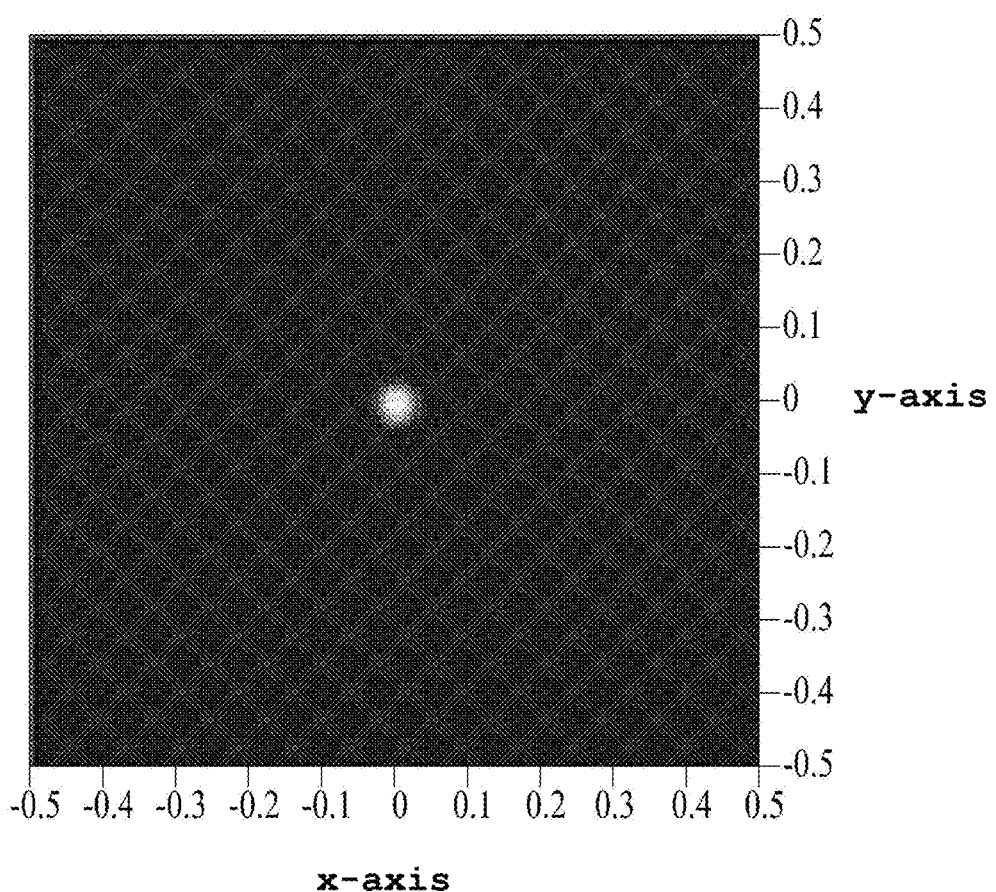
FIGS. 10A to 10C illustrate the forms of light that reaches a wavelength conversion unit.
Figure 10B:
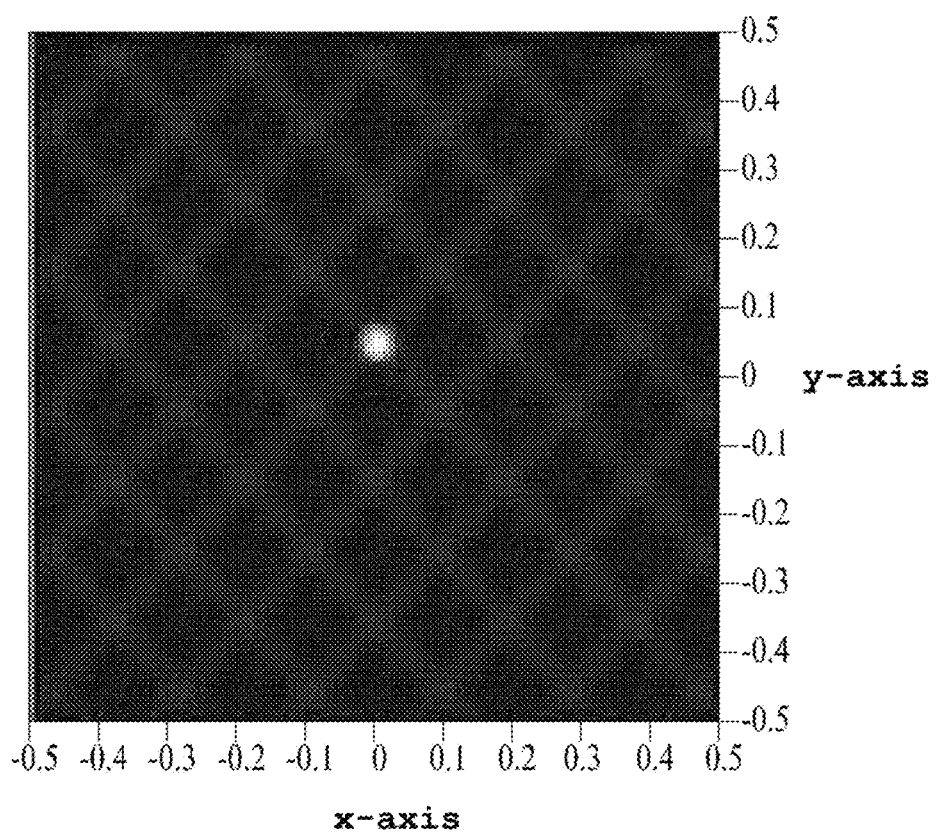
Figure 10C:
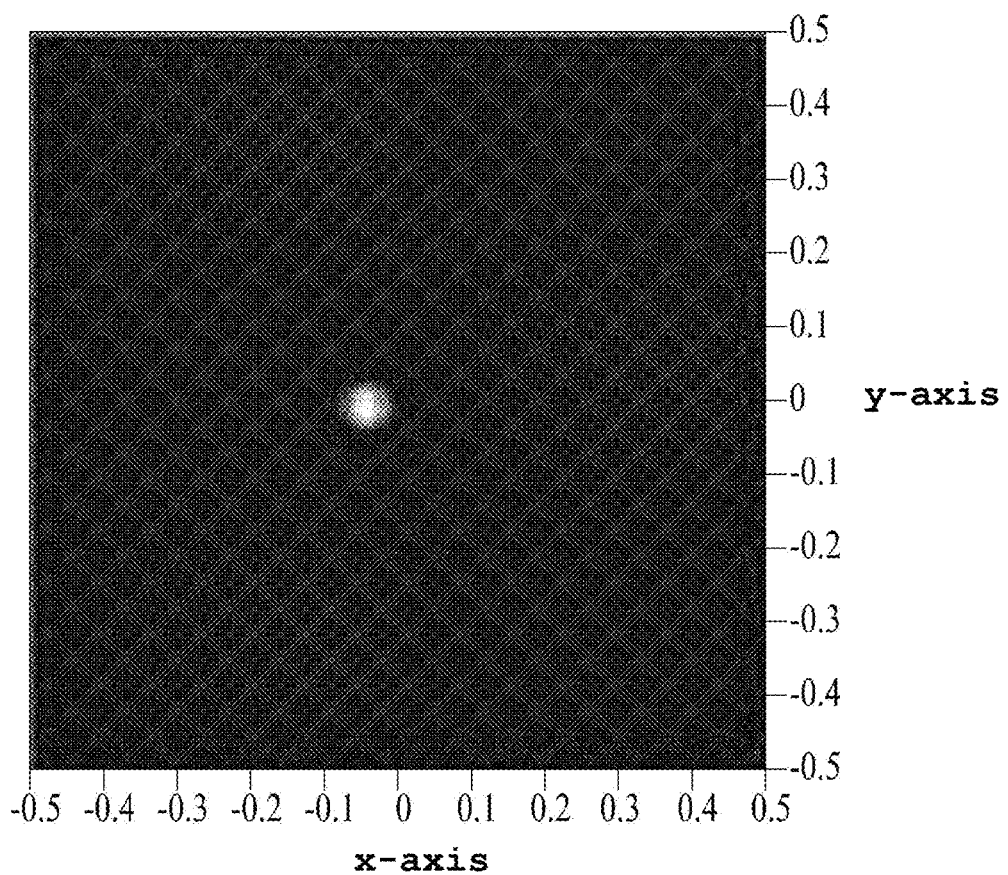

FIGS. 10A to 10C illustrate the forms of light that reaches the wavelength conversion unit 130.

When the refractive member 125 is not moved, that is, when both the first angle α and the second angle β are 0°, the form of light that reaches the wavelength conversion unit 130 is as illustrated in FIG. 10A. In addition, when the refractive member 125 is moved (designated by 125A), as illustrated in FIG. 8, the form of light that reaches the wavelength conversion unit 130 is as illustrated in FIG. 10B. In addition, when the refractive member 125 is moved (designated by 125A), as illustrated in FIG. 9, the form of light that reaches the wavelength conversion unit 130 is as illustrated in FIG. 10C.

As illustrated in FIGS. 10A to 10C, it can be appreciated that the position at which the light reaches the wavelength conversion unit 130 may be changed when moving the refractive member 125.

The greater the thickness T of the refractive member 125 or the higher the refractive index of the refractive member 125, the greater the range within which the position at which the light reaches the wavelength conversion unit 130 is adjustable. At least one of the refractive index or the thickness T of the refractive member 125 may vary based on the size of the entire light-emitting device 100C and the configuration of an optical system 200 illustrated in FIG. 11, which will be described below.

Hereinafter, the configuration and operation of an optical module 500, which includes the light-emitting device 100; 100A, 100B or 100C according to the above-described embodiments, will be described with reference to the accompanying drawings.

Figure 11:
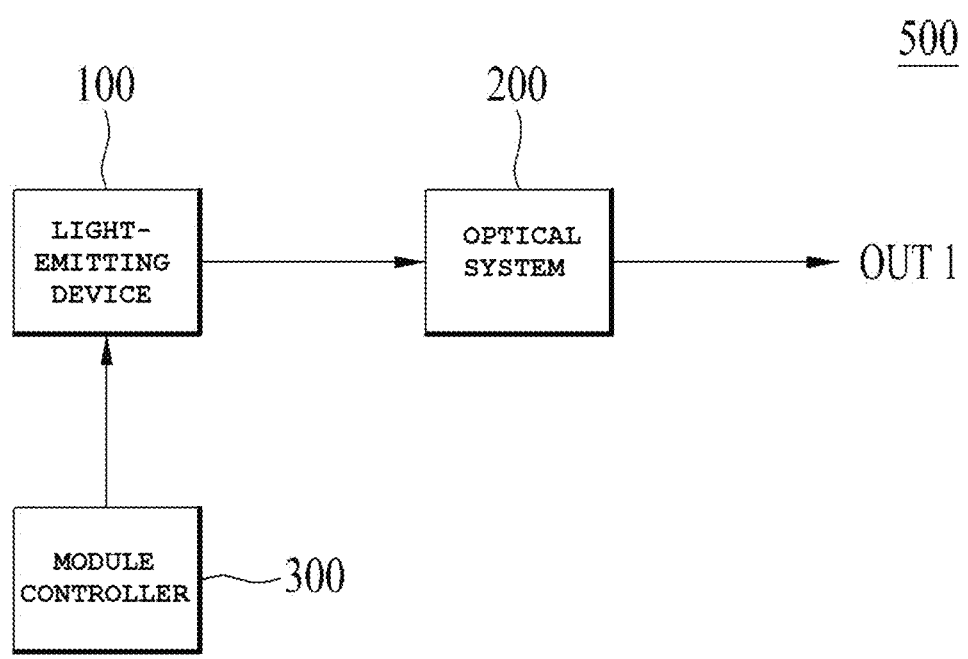
FIG. 11 illustrates a block diagram of an optical module according to an embodiment.

FIG. 11 illustrates a block diagram of the optical module 500 according to an embodiment, and as illustrated, the optical module may include the light-emitting device 100, the optical system 200, and a module controller 300.

The light-emitting device 100 illustrated in FIG. 11 corresponds to the light-emitting device 100 illustrated in FIG. 1, and thus a repeated description thereof will be omitted. Accordingly, the light-emitting device 100 illustrated in FIG. 11 may be any of the light-emitting devices 100A, 100B and 100C according to the above-described embodiments.

The optical system 200 may discharge the converted light, emitted from the light-emitting device 100, towards a subject through an output terminal OUT1. At this time, at least one of the direction or size of the converted light, directed from the light-emitting device 100 to the optical module 200, may be adjusted according as the light-path controller 140 adjusts at least one of the direction or size of the excitation light.

The optical system 200 may include at least one of a reflector, a lens, an actuator, or a motor. Here, the lens included in the optical system 200 may be a double convex lens, a double concave lens, a Meniscus lens, a Fresnel lens, an aspheric lens, or the like. In addition, the reflector included in the optical system 200 may be a parabolic reflector, an oval reflector, a macro focal system reflector (MFR), or the like.

When the optical module 500 illustrated in FIG. 11 is applied for the night vision of a vehicle, which will be described below, the module controller 300 may detect the position of a subject located in front of the vehicle, and may output a module control signal corresponding to the detected result to the light-path controller 140 of the light-emitting device 100. The light-path controller 140 may move at least some of the constituent elements of the light transfer unit 120A, 120B or 120C (e.g., the collimation lens 122-1 in FIG. 3, the second reflecting element 128 in FIG. 6, or the refractive member 125 in FIGS. 8 and 9) in response to the module control signal output from the module controller 300.

The above-described light-emitting device 100; 100A, 100B or 100C or the optical module 500 including the same may be applied to various fields including, for example, domestic or industrial fields in which it is necessary to emit light in a desired direction, or vehicles or various devices, such as a display device or an indicator device. For example, the light-emitting device 100; 100A, 100B or 100C or the optical module 500 including the same according to the above-described embodiments may be applied to a light detection and ranging (LIDAR), for example, a RIDAR that uses a laser.

Hereinafter, the configuration and operation of a vehicle 2000 including the optical module 500 according to the above-described embodiments will be described with reference to the accompanying drawings.

Figure 12:
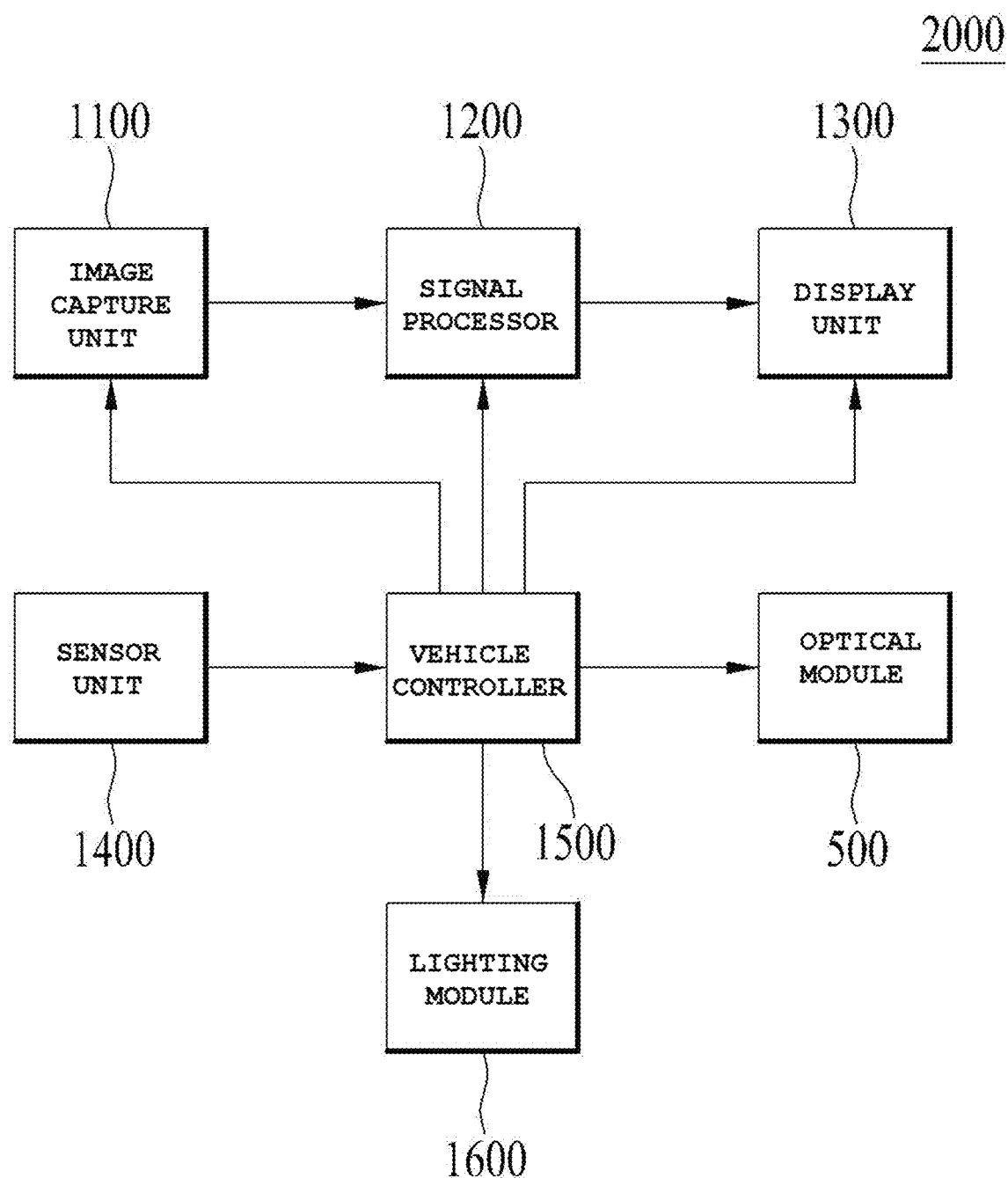
FIG. 12 illustrates a block diagram of a vehicle including the optical module described above.

FIG. 12 is a block diagram of the vehicle 2000 including the optical module 500 described above, and as illustrated, the vehicle may include the optical module 500, an image capture unit 1100, a signal processor 1200, a display unit 1300, a sensor unit 1400, a vehicle controller 1500, and a lighting module 1600.

The image capture unit 1100 captures an image showing the road in front of the vehicle 2000 to produce a video signal, and outputs the produced video signal to the signal processor 1200.

The signal processor 1200 processes the video signal, received from the image capture unit 1100, to extract a portion of the captured image, and outputs the extracted result to the display unit 1300.

The display unit 1300 displays a portion of the captured image from the video signal to a driver.

The sensor unit 1400 senses at least one of the movement speed or direction of the vehicle, and outputs the sensed result to the vehicle controller 1500. In some cases, the sensor unit 1400 may be omitted.

The vehicle controller 1500 may generate a vehicle control signal for controlling the image capture unit 1100, the display unit 1300, and the signal processor 1200. In particular, the vehicle controller 1500 may produce the vehicle control signal using the sensed result from the sensor unit 1400.

The light-path controller 140 of the light-emitting device 100 included in the optical module 500 may move the light transfer unit 120 in response to the vehicle control signal generated by the vehicle controller 1500 and the module control signal generated by the module controller 300.

Here, the lighting module 1600 may cause at least one of a high beam or a low beam to emit light under the control of the vehicle controller 1500. As such, it can be appreciated that the optical module 500 according to the embodiments serves as a high beam, a low beam, or some other auxiliary lamp in the vehicle 2000. For example, the optical module 500 may be used as an auxiliary lamp for securing visibility, for example, night vision, by emitting light towards a subject located in front of the vehicle. That is, the optical module 500 may be additionally used as an auxiliary lamp in the state in which a high beam or a low beam of the lighting module 1600 is turned on.

Generally, in order to realize a night detection function such as a night-vision- or night-view-providing function, an optical module is required for sending light in the direction in which a subject, such as the road surface, persons, animals, or articles, is located. Since such an optical module is an auxiliary light source, it may be preferable not to occupy a large volume in the entire vehicle lighting system. The optical module may require a high-brightness light source since it is necessary to brighten a subject. Nevertheless, conventionally, the optical module uses an LED, which occupies a larger volume than an LD and has lower brightness, and includes an actuator, a motor, or the like, which operates the optical module, since the entire optical module needs to be moved upwards, downwards, leftwards, or rightwards. However, moving the entire optical module causes great power consumption, is inefficient, and requires increased space for the movement of the entire optical module.

On the other hand, when the optical module 500 according to the embodiments is applied, the light-emitting device 100 emits light towards a subject by moving only a specific part thereof (e.g., the collimation lens 122-1 illustrated in FIG. 3, the second reflecting element 128 illustrated in FIG. 6, or the refractive member 125 illustrated in FIG. 8). Thus, since the light may be emitted towards the subject without moving the entire light-emitting device 100 and the entire optical system 200, power consumption may be reduced. In addition, since only a specific part inside the light-emitting device 100; 100A, 100B or 100C is moved without moving the entire optical module 200, the amount of space for the optical module 500 may be more reduced, compared to the case in which the entire optical module is moved. In addition, the light may be emitted to a greater number of subdivided positions in front of the vehicle, compared to the existing case in which the entire optical module is moved. For example, as illustrated in FIG. 5, the position at which the light reaches may be further subdivided. In addition, since only a specific part 122-1, 128, or 125 of the light-emitting device 100 is moved, unlike the existing case in which the entire optical module is moved, the freedom of movement may increase.

In addition, the light-emitting device according to the embodiments uses, as a light source, an LD that has brightness five times to ten times higher than the brightness of an LED. Thus, the efficiency of irradiation of a subject may be increased. In addition, the LD has a smaller divergence angle than that of the LED, and is capable of transmitting light long distances. In addition, compared to an LED, the LD may reduce the volume of the optical module 500, may facilitate easier design, compared to the existing case in which it is necessary to move the entire optical module 500 (or the entire optical system 200), and may be suitable in terms of the aesthetic design of a headlamp, which is becoming slimmer.

Although embodiments have been described with reference to a number of illustrative embodiments thereof, it should be understood that numerous other modifications and applications may be devised by those skilled in the art that will fall within the intrinsic aspects of the embodiments. More particularly, various variations and modifications are possible in concrete constituent elements of the embodiments. In addition, it is to be understood that differences relevant to the variations and modifications fall within the spirit and scope of the present disclosure defined in the appended claims.

MODE FOR INVENTION

Various embodiments have been described in the best mode for carrying out the disclosure.

INDUSTRIAL APPLICABILITY

A light-emitting device and an optical module including the device according to the embodiments may be used in various fields such as domestic or industrial applications, vehicles, or various devices such as a display device or an indicator device.

The invention claimed is:

1. A light-emitting device, comprising:
at least one light source configured to discharge excitation light;
a wavelength conversion unit configured to convert a wavelength of the excitation light so as to emit the excitation light having the converted wavelength as converted light;
a light transfer unit disposed on a light path between the at least one light source and the wavelength conversion unit to transfer the excitation light to the wavelength conversion unit; and
a light-path controller configured to adjust a direction and a size of the excitation light to be incident on the wavelength conversion unit by moving at least a portion of the light transfer unit.

2. The light-emitting device according to claim 1, wherein the light source discharges laser light as the excitation light.

3. The light-emitting device according to claim 1, wherein the light source comprises a light-emitting diode configured to discharge the excitation light.

4. The light-emitting device according to claim 1, wherein the light transfer unit comprises at least one collimation lens configured to emit the excitation light, discharged from the at least one light source, in parallel.

5. The light-emitting device according to claim 4, wherein the light-path controller adjusts the direction and the size of the excitation light by moving the at least one collimation lens.

6. The light-emitting device according to claim 4, wherein the at least one light source comprises a plurality of light sources configured to discharge the excitation light respectively, and the at least one collimation lens comprises a plurality of collimation lenses configured to emit the excitation light, discharged from the plurality of light sources, in parallel, and wherein the light transfer unit further comprises:
a light-path conversion unit configured to gather a plurality of beams of the excitation light discharged from the plurality of collimation lenses into a single light beam; and
a first reflecting element configured to reflect the single light beam.

7. The light-emitting device according to claim 6, wherein the plurality of light sources comprise first and second light sources configured to discharge first light and second light respectively, and
wherein the light-path conversion unit comprises a light-transmitting/reflecting element configured to transmit the first light in a first direction and reflect the second light, which is incident thereon in a second direction, which is orthogonal to the first direction, in the first direction so as to emit the single light beam.

8. The light-emitting device according to claim 6, wherein the plurality of light sources comprise first and second light sources configured to discharge first light and second light respectively, and
wherein the light-path conversion unit comprises:
a prism reflecting a second light which is incident in a direction parallel to a first direction in which a first light, which is one of the plurality of beams of the excitation light, is incident, the second light being another one of the plurality of beams of the excitation light, and the second direction being orthogonal to the first direction; and
a light-transmitting/reflecting element configured to transmit the first light in the first direction and to reflect the second light, which is reflected in the second direction by the prism, in the first direction so as to emit the single light beam.

9. The light-emitting device according to claim 8, wherein the light-transmitting/reflecting element comprises a polarization beam splitter or a birefringent material.

10. The light-emitting device according to claim 9, wherein the light transfer unit further comprises an anti-reflection film coated over each of a light entrance surface and a light exit surface of the light-transmitting/reflecting element.

11. The light-emitting device according to claim 6, wherein the light transfer unit further comprises a second reflecting element configured to reflect the light, reflected from the first reflecting element, to the wavelength conversion unit.

12. The light-emitting device according to claim 11, wherein the light-path controller adjusts the direction and the size of the excitation light by moving the second reflecting element.

13. The light-emitting device according to claim 6, wherein the light transfer unit further comprises a refractive member configured to refract the single light beam gathered by the light-path conversion unit, and
wherein the first reflecting element reflects the light refracted by the refractive member.

14. The light-emitting device according to claim 13, wherein the refractive member comprises a glass plate.

15. The light-emitting device according to claim 13, wherein the light-path controller adjusts the direction and the size of the excitation light by moving the refractive member.

16. The light-emitting device according to claim 15, wherein the light-path controller rotates the refractive member at a first angle relative to a second direction or at a second angle relative to a third direction, or rotates the refractive member at the second angle relative to the third direction while rotating the refractive member at the first angle relative to the second direction, and
wherein the excitation light is incident on the wavelength conversion unit in a first direction, and each of the second and third directions differs from the first direction.

17. The light-emitting device according to claim 1, wherein the wavelength conversion unit is disposed at an outer side of a focal point so as to be spaced apart from the focal point in a direction away from the light source, is disposed at the focal point, or is disposed at an inner side of the focal point so as to be spaced apart from the focal point in a direction approaching the light source.

18. A light-emitting device, comprising:
at least one light source configured to discharge excitation light, wherein the at least one light source comprises a plurality of light sources configured to discharge the excitation light, respectively;
a wavelength conversion unit configured to convert a wavelength of the excitation light so as to emit the excitation light having the converted wavelength as converted light;
a light transfer unit disposed on a light path between the at least one light source and the wavelength conversion unit, the light transfer unit to transfer the excitation light from the plurality of light sources to the wavelength conversion unit, wherein the light transfer unit comprises:
a plurality of collimation lenses configured to emit the excitation light, discharged from the plurality of light sources, in parallel,
a light-path conversion unit configured to gather a plurality of beams of the excitation light discharged from the plurality of collimation lenses into a single light beam; and
a first reflecting element configured to reflect the single light beam, wherein each of the plurality of collimation lenses, the light-path conversion unit and the first reflecting element is disposed on the light path prior to the wavelength conversion unit; and
a light-path controller configured to adjust a direction and a size of the excitation light to be incident on the wavelength conversion unit by moving at least a portion of the light transfer unit disposed on the light path prior to the wavelength conversion unit.

* * * * *